United States Patent
Chuang

(10) Patent No.: US 10,727,676 B2
(45) Date of Patent: Jul. 28, 2020

(54) HEAD-MOUNTED DISPLAY SYSTEM

(71) Applicant: ACER INCORPORATED, New Taipei (TW)

(72) Inventor: Meng-Chieh Chuang, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 299 days.

(21) Appl. No.: 15/885,679

(22) Filed: Jan. 31, 2018

(65) Prior Publication Data

US 2019/0081494 A1 Mar. 14, 2019

(30) Foreign Application Priority Data

Sep. 12, 2017 (TW) .............................. 106131239 A

(51) Int. Cl.
| | |
|---|---|
| G06F 13/38 | (2006.01) |
| G06F 13/40 | (2006.01) |
| G06F 13/42 | (2006.01) |
| H02J 7/00 | (2006.01) |
| H03K 17/60 | (2006.01) |
| H03K 17/687 | (2006.01) |

(52) U.S. Cl.
CPC .............. *H02J 7/00* (2013.01); *G06F 13/385* (2013.01); *G06F 13/4022* (2013.01); *G06F 13/4081* (2013.01); *G06F 13/4282* (2013.01); *G06F 2213/0042* (2013.01); *H03K 17/60* (2013.01); *H03K 17/6872* (2013.01)

(58) Field of Classification Search
USPC ......................................................... 307/113
See application file for complete search history.

(56) References Cited

U.S. PATENT DOCUMENTS

| | | | |
|---|---|---|---|
| 2017/0115689 A1 | 4/2017 | Liu | |
| 2017/0222474 A1* | 8/2017 | Kefalos | ................ H02J 7/1446 |
| 2017/0235694 A1 | 8/2017 | Lee | |
| 2018/0034304 A1* | 2/2018 | Deng | ..................... H02J 50/90 |

FOREIGN PATENT DOCUMENTS

| | | |
|---|---|---|
| CN | 201741121 U | 2/2011 |
| CN | 106059012 A | 10/2016 |
| CN | 106980467 A | 7/2017 |
| TW | 201608281 A | 3/2016 |
| WO | 2017/126828 A1 | 7/2017 |

OTHER PUBLICATIONS

USB Power Delivery Specification Revision 3.0, Version 1.1, Jan. 12, 2017, cover page and pp. 528-529, XP055485373.

* cited by examiner

*Primary Examiner* — Rexford N Barnie
*Assistant Examiner* — Xuan Ly
(74) *Attorney, Agent, or Firm* — Winston Hsu

(57) ABSTRACT

A head-mounted display system includes a head-mounted display gear, a host, and two USB Type-C transmission lines. The two USB Type-C transmission lines are coupled between the head-mounted display gear and the host for transmitting power, data and video streams.

6 Claims, 2 Drawing Sheets

HEAD-MOUNTED DISPLAY SYSTEM

CROSS REFERENCE TO RELATED APPLICATION

This application claims priority of Taiwan Application No. 106131239 filed on 2017 Sep. 12.

BACKGROUND OF THE INVENTION

1. Field of the Invention

The present invention is related to a head-mounted display system, and more particularly, to a head-mounted display system with high signal quality and light weight.

2. Description of the Prior Art

With rapid development of technology, home entertainment multi-media systems implemented with head-mounted display (HMD) have become widespread. An HMD is a 3D optical product worn on the head of a user for a total immersion of the user in whatever experience the display is meant for, as it ensures that no matter where the user's head may turn, the display is positioned right in front of the user's eyes. HMDs are widely used in augmented reality (AR) or virtual reality (VR) systems and configured to function as input devices capable of monitor user reaction and change user view accordingly. An HMD can display computer-generated imagery (CGI) in VR applications or allow a CGI to be superimposed on real-world view in AR applications.

Existing HMD products require various types of complicated and bulky transmission lines for separately handling power, image and data transmission. Such prior art HMDs provide poor user experiences in VR or AR applications due to poor maneuverability and discomfort. Therefore, there is a need for a head-mounted display system with high signal quality and light weight.

SUMMARY OF THE INVENTION

The present invention provides a head-mounted display system including a head-mounted display gear, a host, and a USB Type-C transmission line coupled between the head-mounted display gear and the host for transmitting power, data and a video stream.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
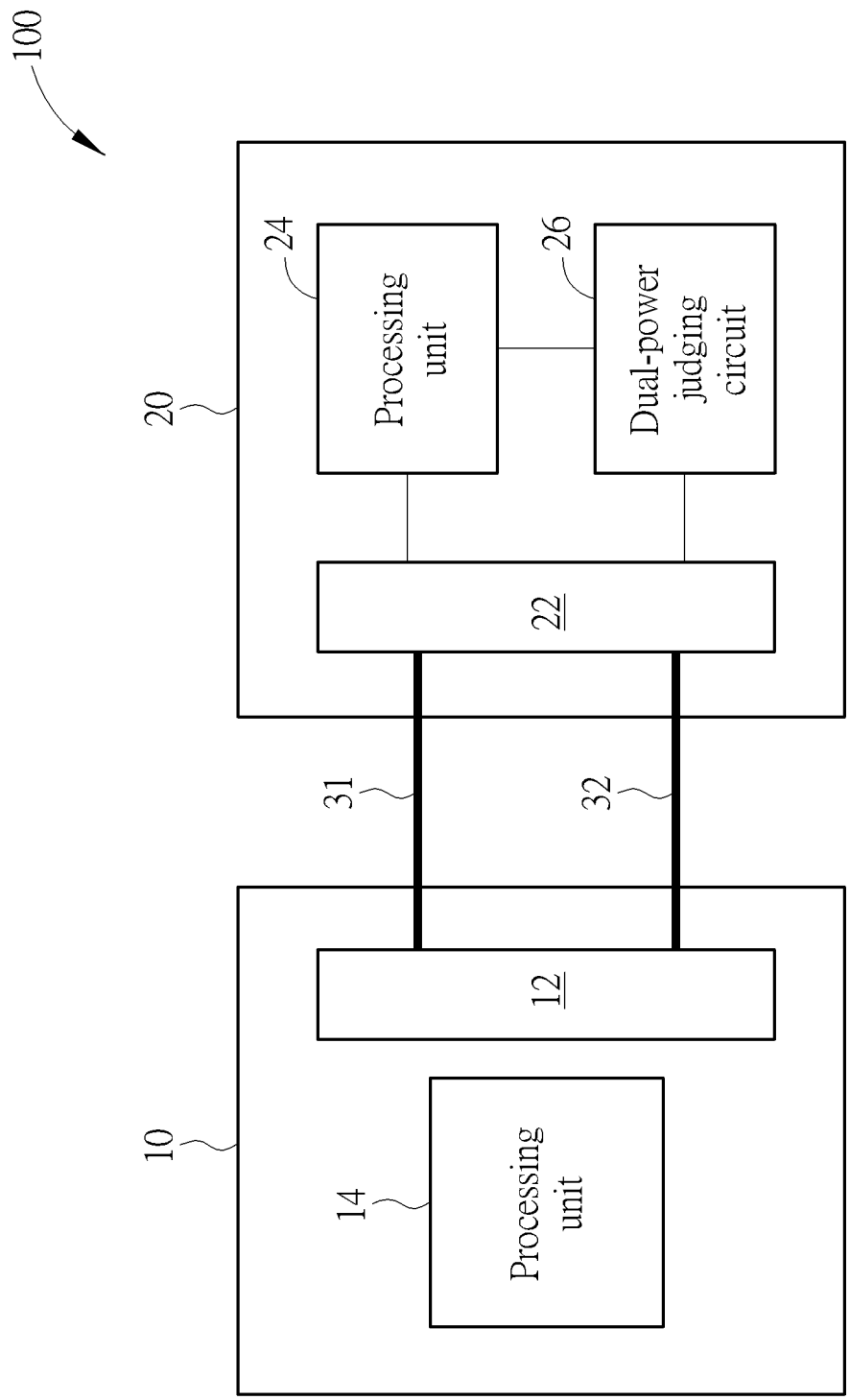
FIG. 1 is a functional diagram illustrating a head-mounted display system capable of transmitting power, data and video streams using USB Type-C ports according to an embodiment of the present invention.

FIG. 1 is a functional diagram illustrating a head-mounted display system 100 capable of transmitting power, data and video streams using USB Type-C ports according to an embodiment of the present invention. The head-mounted display system 100 includes a head-mounted display gear 10, a host 20, and two Universal Serial Bus (USB) Type-C transmission lines 31 and 32. Charging, data transmission and video output may be conducted between the head-mounted display gear 10 and the host 20 via the USB Type-C transmission lines 31 and 32.

The head-mounted display gear 10 includes an input/output interface 12 and a processing unit 14. The host 20 includes an input/output interface 22, a processing unit 24, and a dual-power judging circuit 30. The input/output interface 12 of the head-mounted display gear 10 and the input/output interface 22 of the host 20 include at least two USB Type-C capable transmission ports for accommodating the USB Type-C transmission line 31 and 32, thereby electrically connecting the head-mounted display gear 10 with the host 20. Before the head-mounted display system 100 is in operation, the processing unit 14 of the head-mounted display gear 10 and the processing unit 24 of the host 20 are configured to communicate with each other so as to ensure correct settings on both sides. Next, the host 20 may transmit audio and video data to the head-mounted display gear 10 using a "DisplayPort Alternate Mode over USB Type-C" protocol via the USB Type-C transmission lines 31 and 32. The head-mounted display gear 10 may also transmit head orientation data to the host 20 using a USB interface protocol. Meanwhile, since the host 20 is able to provide power for the head-mounted display gear 10 using a USB power delivery (PD) protocol, the head-mounted display gear 10 does not need to include extra batteries, which reduces its weight and provides easier user maneuverability.

In the present invention, the head-mounted display gear 10 may be fabricated as a goggle or a helmet. The host 20 may be a game console, a desktop computer, a tablet computer, or a smartphone. However, the types of the head-mounted display gear 10 and the host 20 do not limit the scope of the present invention.

As previous stated, before the head-mounted display system 100 is in operation, the processing unit 14 of the head-mounted display gear 10 and the processing unit 24 of the host 20 are configured to communicate with each other so as to ensure correct settings on both sides. If the voltage on the VBUS line of the USB Type-C transmission line 31 or 32 exceeds about 0.8V before the communication starts, the processing unit 24 of the host 20 may misjudge the status of the head-mounted display gear 10. Different USB standards may provide different charging capabilities according to USB PD protocol, wherein the USB Type-C standard can provide charging capability of 5V/500 mA, 5V/900 mA, or 5V/1.5 A. However, for VR or AR application, two USB Type-C transmission lines 31 and 32 are required to provide sufficient charging capability of 5V/3 A to ensure proper operation of the head-mounted display system 100. Under such circumstance, when one of two USB Type-C transmission lines 31 and 32 with charging capability of 5V/1.5 A is plugged in, the 5V voltage established on the VBUS line causes abnormal operation since the processing unit 24 of the host 20 may misjudge the status of the head-mounted display gear 10. Therefore, the present invention uses the dual-power judging circuit 30 to control the power supply of two USB Type-C transmission lines 31 and 32.

Figure 2:
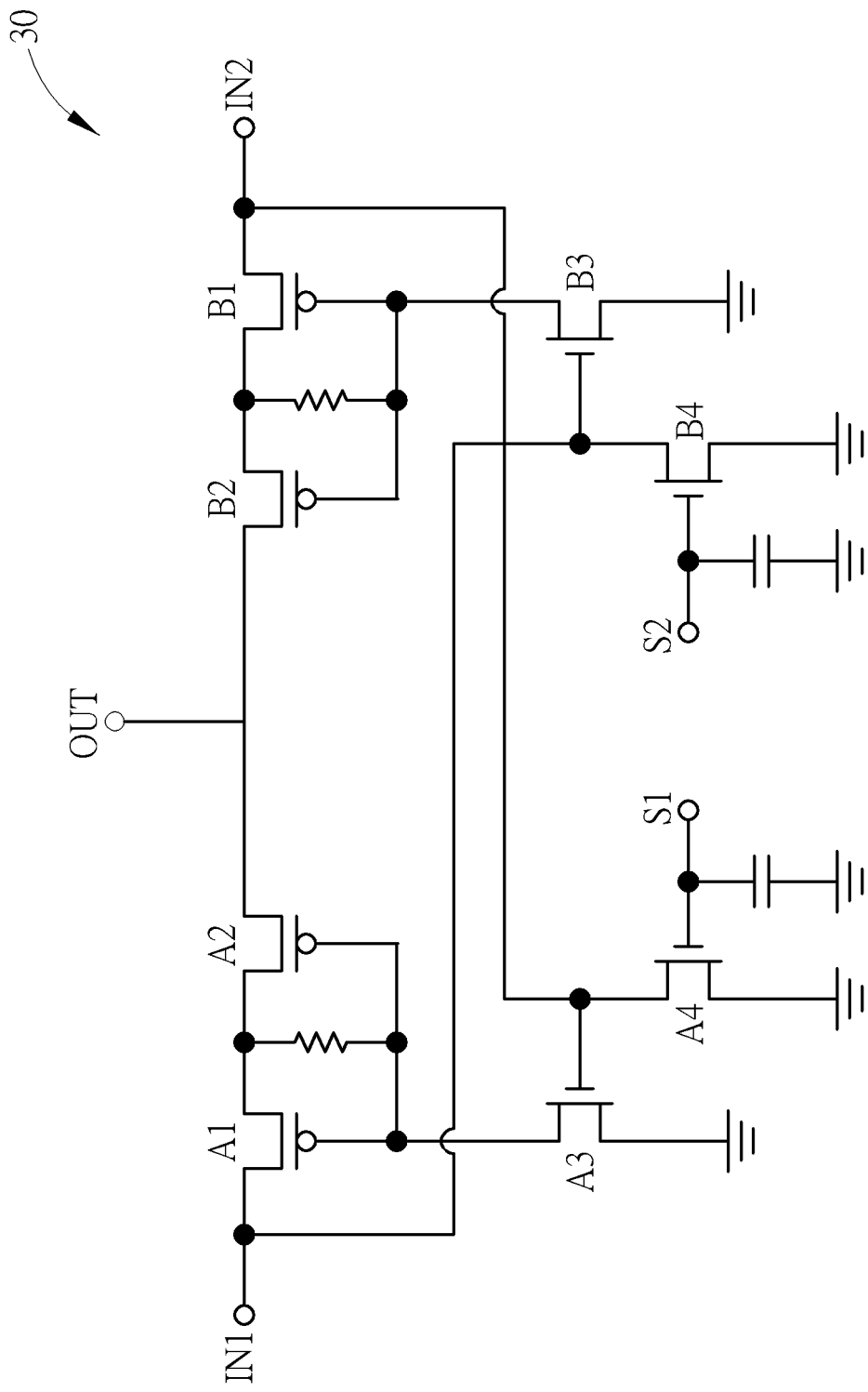
FIG. 2 is a diagram illustrating a dual-power judging circuit according to an embodiment of the present invention.

FIG. 2 is a diagram illustrating the dual-power judging circuit 30 according to an embodiment of the present invention. The dual-power judging circuit 30 includes two input ends IN1 and IN2, an output end OUT, and switching devices A1~A4 and B1~B4. The input end IN1 is coupled to a first transmission port in the input/output interface 22, and the input end IN2 is coupled to a second transmission port in the input/output interface 22, wherein the first transmission port is used to accommodate the USB Type-C transmission line 31 and the second transmission port is used to accommodate the USB Type-C transmission line 32. The switching devices A1~A4 and B1~B4 are configured to determine whether the USB Type-C transmission lines 31 and 32 are plugged in. When detecting that both the USB Type-C transmission lines 31 and 32 are plugged in, the switching devices A1~A4 and B1~B4 are configured to allow system power to be provided on the output end OUT for supplying the operation of the head-mounted display system 100.

In the present invention, the switching devices A1~A4 and B1~B4 are three-terminal devices each including a first end, a second end and a control end. The switching devices A1~A4 and B1~B4 may be metal-oxide-semiconductor field-effect transistors (MOSFETs), bipolar junction transistors (BJTs), or other switching devices with similar function. In the embodiment depicted in FIG. 2, the switching devices A1~A2 and B1~B2 are P-type metal-oxide-semiconductor field-effect transistors (P-MOSFETs), while the switching devices A3~A4 and B3~B4 are N-type metal-oxide-semiconductor field-effect transistors (N-MOSFETs). However, the type of the switching devices A1~A4 and B1~B4 does not limit the scope of the present invention.

The first end of the switching device A1 is coupled to the input end IN1, the first end of the switching device A2 is coupled to the output end OUT, and the second end of the switching device A1 is coupled to the second end of the switching device A2. The switching device A3 includes a first end coupled to the control end of the switching device A1 and the control end of the switching device A2, a second end coupled to a reference voltage (such as ground voltage), and a control end coupled to the input end IN2. The switching device A4 includes a first end coupled to the input end IN2, a second end coupled to a reference voltage (such as ground voltage), and a control end coupled to the processing unit 24 for receiving a general-purpose input/output (GPIO) signal S1. The first end of the switching device B1 is coupled to the input end IN2, the first end of the switching device B2 is coupled to the output end OUT, and the second end of the switching device B1 is coupled to the second end of the switching device B2. The switching device B3 includes a first end coupled to the control end of the switching device B1 and the control end of the switching device B2, a second end coupled to a reference voltage (such as ground voltage), and a control end coupled to the input end IN1. The switching device B4 includes a first end coupled to the input end IN1, a second end coupled to a reference voltage (such as ground voltage), and a control end coupled to the processing unit 24 for receiving a second GPIO signal S2.

When only the USB Type-C transmission line 31 among the USB Type-C transmission lines 31 and 32 is plugged in, the input end IN1 is at a high level and the input end IN2 is at a low level. The switching device A3 is turned off (open-circuited), thereby turning off the switching devices A1 and A2. Under such circumstance, the head-mounted display system 100 is shut down. When plugging in the USB Type-C transmission line 32 with the USB Type-C transmission line 31 already plugged in, the input end IN2 is at a high level. The switching device A3 is then turned on (short-circuited), thereby turning on the switching devices A1 and A2. Under such circumstance, electrical power, data and video streams may be transmitted between the head-mounted display gear 10 (via the input ends IN1 and IN2) and the host 20 (via the output end OUT). Similarly, when only the USB Type-C transmission line 32 among the USB Type-C transmission lines 31 and 32 is plugged in, the input end IN2 is at a high level and the input end IN1 is at a low level. The switching device B3 is turned off (open-circuited), thereby turning off the switching devices B1 and B2. Under such circumstance, the head-mounted display system 100 is shut down. When plugging in the USB Type-C transmission line 31 with the USB Type-C transmission line 32 already plugged in, the input end IN1 is at a high level. The switching device B3 is then turned on (short-circuited), thereby turning on the switching devices B1 and B2. Under such circumstance, electrical power, data and video streams may be transmitted between the head-mounted display gear 10 (via the input ends IN1 and IN2) and the host 20 (via the output end OUT).

On the other hand, with both the USB Type-C transmission lines 31 and 32 plugged in, when the USB Type-C transmission line 31 is unplugged, the processing unit 24 may detect a corresponding voltage variation on the input end IN1, thereby sending a high-level GPIO signal S2 for turning on the switching device B4. The switching devices B1 and B3 are then turned off, thereby allowing the output end OUT to begin discharging. Similarly, with both the USB Type-C transmission lines 31 and 32 plugged in, when the USB Type-C transmission line 32 is unplugged, the processing unit 24 may detect a corresponding voltage variation on the input end IN2, thereby sending a high-level GPIO signal S1 for turning on the switching device A4. The switching devices A1 and A3 are then turned off, thereby allowing the output end OUT to begin discharging. After discharging via the output end OUT, the head-mounted display system 100 is shut down and may resume normal operation only when both the USB Type-C transmission lines 31 and 32 are plugged in again.

In conclusion, the present invention uses the USB Type-C interface to provide image, data and power transmissions in head-mounted display systems without the need of complicated and bulky transmission lines. For VR or AR application, the present invention uses two USB Type-C transmission lines to provide sufficient charging capability. A dual-power judging circuit is adopted to monitor the plugged-in status of the two USB Type-C transmission lines so as to ensure correct judgment of the host. Therefore, the present invention provides a head-mounted display system with high signal quality and light weight.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A head-mounted display system, comprising:
   a head-mounted display gear;
   a host;
   a first Universal Serial Bus (USB) Type-C transmission line coupled between the head-mounted display gear and the host for transmitting power, data and a video stream; and
   a second USB Type-C transmission line coupled between the head-mounted display gear and the host for transmitting the power, the data and the video stream, wherein the host comprises:
      an input/output interface comprising:
         a first transmission port arranged to accommodate the first USB Type-C transmission line; and a second transmission port arranged to accommodate the second USB Type-C transmission line; and
a dual-power judging circuit comprising:
  a first input end coupled to the first transmission port;
  a second input end coupled to the second transmission port;
  an output end;
  a first switching device comprising:
    a first end coupled to the first input end;
    a second end; and
    a control end;
  a second switching device comprising:
    a first end coupled to the output end;
    a second end coupled to the second end of the first switching device; and
    a control end coupled to the control end of the first switching device;
  a third switching device comprising:
    a first end coupled to the control end of the first switching device and the control end of the second switching device;
    a second end coupled to a reference voltage; and
    a control end coupled to the second input end;
  a fourth switching device comprising:
    a first end coupled to the second input end;
    a second end coupled to the reference voltage; and
    a control end coupled to a first general-purpose input/output (GPIO) signal;
  a fifth switching device comprising:
    a first end coupled to the second input end;
    a second end; and
    a control end;
  a sixth switching device comprising:
    a first end coupled to the output end;
    a second end coupled to the second end of the fifth switching device; and
    a control end coupled to the control end of the fifth switching device;
  a seventh switching device comprising:
    a first end coupled to the control end of the fifth switching device and the control end of the sixth switching device;
    a second end coupled to the reference voltage; and
    a control end coupled to the first input end; and
  an eighth switching device comprising:
    a first end coupled to the first input end;
    a second end coupled to the reference voltage; and
    a control end coupled to a second GPIO signal.

2. The head-mounted display system of claim 1, wherein each of the first USB Type-C transmission line and the second USB Type-C transmission line provides a charging capability of 5V/1.5 A.

3. The head-mounted display system of claim 1, wherein the dual-power judging circuit is configured to:
  determine whether the first USB Type-C transmission line is plugged into the first transmission port;
  determine whether the second USB Type-C transmission line is plugged into the second transmission port; and
  allow the host to charge the head-mounted display gear when determining that both the first USB Type-C transmission line and the second USB Type-C transmission line are plugged into the input/output interface.

4. The head-mounted display system of claim 1, wherein the first through the eighth switching devices are metal-oxide-semiconductor field-effect transistors (MOSFETs) or bipolar junction transistors (BJTs).

5. The head-mounted display system of claim 1, wherein the first switching device, the second switching device, the fifth switching device and the sixth switching device are P-type transistors, and the third switching device, the fourth switching device, the seventh switching device and the eighth switching device are N-type transistors.

6. The head-mounted display system of claim 1, wherein the host further comprises a processing unit configured to:
  determine whether the first USB Type-C transmission line is unplugged from the first transmission port by detecting a voltage variation of the first input end;
  determine whether the second USB Type-C transmission line is unplugged from the second transmission port by detecting a voltage variation of the second input end;
  output the second GPIO signal for turning off the fifth switching device when detecting that the first USB Type-C transmission line is unplugged from the first transmission port; and
  output the first GPIO signal for turning off the first switching device when detecting that the second USB Type-C transmission line is unplugged from the second transmission port.

* * * * *